United States Patent
Xie et al.

(10) Patent No.: US 12,438,034 B2
(45) Date of Patent: Oct. 7, 2025

(54) NARROWING SINGLE DIFFUSION BREAK

(71) Applicant: International Business Machines Corporation, Armonk, NY (US)

(72) Inventors: Ruilong Xie, Niskayuna, NY (US); Veeraraghavan S. Basker, Schenectady, NY (US); Kangguo Cheng, Schenectady, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 777 days.

(21) Appl. No.: 17/645,236

(22) Filed: Dec. 20, 2021

(65) Prior Publication Data
US 2023/0197503 A1 Jun. 22, 2023

(51) Int. Cl.
| | |
|---|---|
| *H10D 30/62* | (2025.01) |
| *H01L 21/762* | (2006.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ..... *H01L 21/76224* (2013.01); *H10D 64/021* (2025.01); *H10D 84/013* (2025.01); *H10D 84/0151* (2025.01); *H10D 84/038* (2025.01); *H10D 84/83* (2025.01)

(58) Field of Classification Search
None
See application file for complete search history.

(56) References Cited

U.S. PATENT DOCUMENTS

| | | | |
|---|---|---|---|
| 9,412,616 | B1 | 8/2016 | Xie et al. |
| 9,589,845 | B1 | 3/2017 | Jagannathan et al. |
| 9,935,104 | B1 | 4/2018 | Wang et al. |
| 10,014,296 | B1 | 7/2018 | Dou et al. |
| 10,950,506 | B2 | 3/2021 | Xie et al. |
| 10,985,161 | B2 | 4/2021 | Xu et al. |
| 11,024,739 | B2 | 6/2021 | Cheng |
| 2016/0225762 | A1 | 8/2016 | Zang et al. |
| 2017/0141211 | A1* | 5/2017 | Xie ........................ H10D 30/62 |
| 2020/0006559 | A1* | 1/2020 | Mehandru .............. H10D 84/83 |
| 2020/0227323 | A1* | 7/2020 | Zang .................... H10D 84/038 |
| 2020/0373196 | A1 | 11/2020 | Li et al. |

* cited by examiner

*Primary Examiner* — Steven B Gauthier
*Assistant Examiner* — Lamont B Koo
(74) *Attorney, Agent, or Firm* — Patterson + Sheridan, LLP

(57) ABSTRACT

Embodiments herein describe semiconductor devices with single diffusion breaks that are narrower than the gates of transistors in those devices. That is, rather than forming the diffusion breaks using a dummy gate (which would result in the diffusion breaks having the same width as the gates of the transistors) the embodiments herein use different means to establish the width of the diffusion break. As a result, the diffusion break can be narrower than traditional diffusion breaks formed using dummy gates, thereby saving area in the semiconductor device.

8 Claims, 14 Drawing Sheets

NARROWING SINGLE DIFFUSION BREAK

BACKGROUND

The present invention relates to using a single diffusion break between active regions in a semiconductor device.

Many semiconductor devices use double diffusion breaks formed using two dummy gates to separate active regions (e.g., regions containing transistors). However, using two dummy gates to form the diffusion breaks waste a significant amount of space in the semiconductor device. Recent semiconductor devices include single diffusion breaks formed using only one dummy gate. That is, one dummy gate in the semiconductor device is removed and then replaced with a diffusion break material. While this saves area relative to the double diffusion breaks, the single diffusion break still requires a significant amount of space in the device.

SUMMARY

According to one embodiment of the present invention, a semiconductor device includes a first active region comprising a first transistor with a first gate disposed on a substrate, a second active region comprising a second transistor with a second gate disposed on the substrate, and a diffusion break region disposed between the first and second active regions where the diffusion break region includes a diffusion break that extends into the substrate and has a width that is less than widths of the first and second gates.

According to one embodiment of the present invention, a method includes forming a plurality of dummy gates on a substrate where a diffusion break region is defined between two directly neighboring dummy gates of the dummy gates, forming a sacrificial liner between the two dummy gates where the sacrificial liner defines a gap within the diffusion break region, etching the gap to form a deeper gap that extends through channel material and into the substrate, and filling the deeper gap with a material of a diffusion break.

According to one embodiment of the present invention, a semiconductor device includes a first active region comprising a first transistor, a second active region comprising a second transistor, and a diffusion break region disposed between the first and second active regions where the diffusion break region includes a diffusion break and a spacer liner disposed on both sides of the diffusion break. Moreover, a combined width of the diffusion break and the spacer liner is 15 nm or less.

BRIEF DESCRIPTION OF THE DRAWINGS

FIGS. 2A-2I illustrate forming a single diffusion break that is narrower than a gate, according to one embodiment.

DETAILED DESCRIPTION

Embodiments herein describe semiconductor devices with single diffusion breaks that are narrower than the gates of transistors in those devices. That is, rather than forming the diffusion breaks using a dummy gate (which would result in the diffusion breaks having the same width as the gates of the transistors) the embodiments herein use a conformal sacrificial liner to establish the width of the diffusion break. As a result, the diffusion break can be narrower than traditional diffusion breaks formed using dummy gates, thereby saving area in the semiconductor device.

Figure 1:
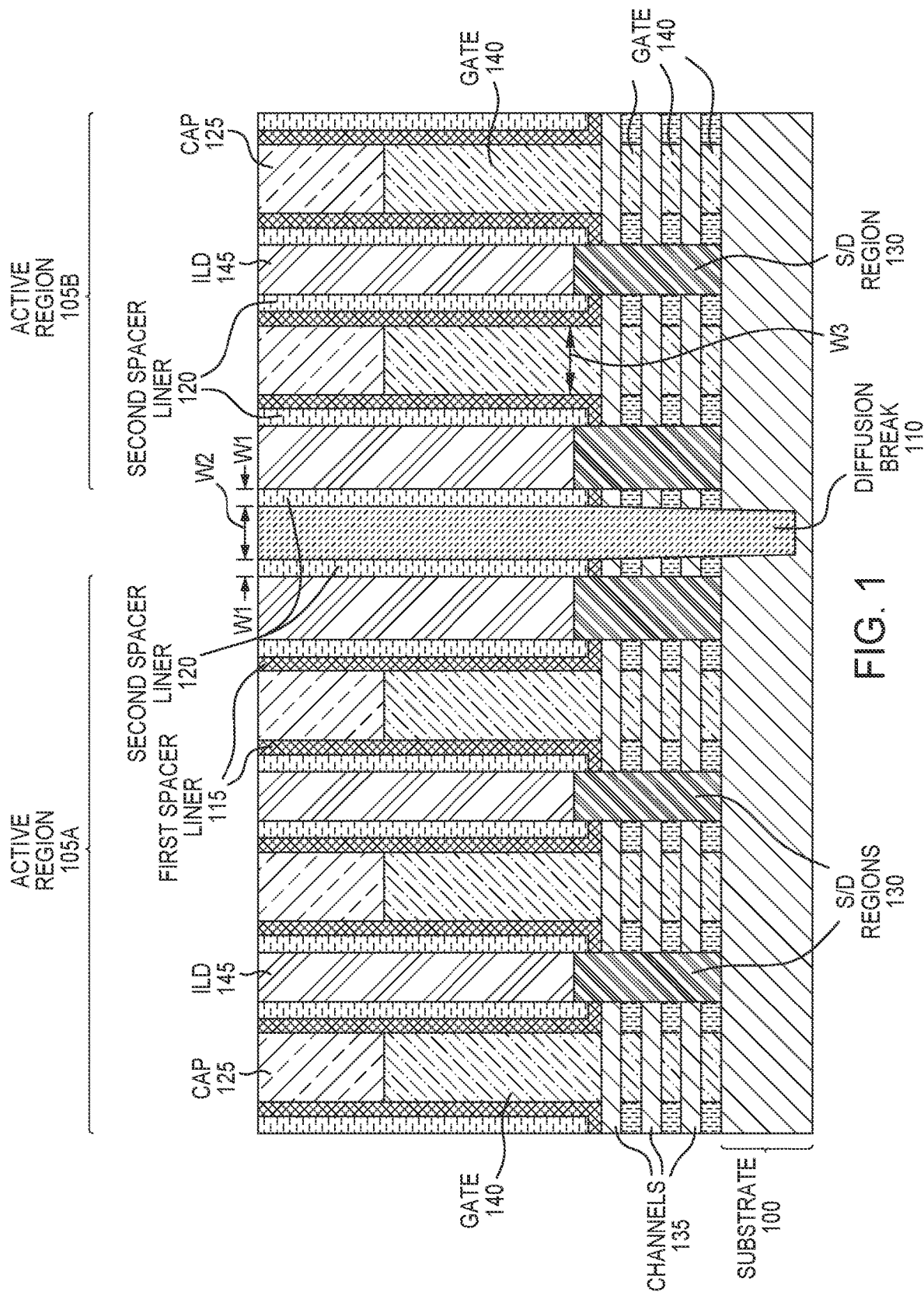
FIG. 1 illustrates a single diffusion break that is narrower than a gate, according to one embodiment.

FIG. 1 illustrates a single diffusion break 110 that is narrower than a gate 140, according to one embodiment. FIG. 1 illustrates a semiconductor device with two active regions 105A and 105B separated by the diffusion break 110. For example, the active region 105A may include one or more transistors (e.g., horizontal or vertical field effect transistors (FET)) that are separated by the diffusion break 110 from one or more transistors in the active region 105B. The diffusion break 110 electrically isolates the transistors in the active regions 105.

The active regions 105 include transistors with source/drain (S/D) regions 130 connected by channels 135. The channels 135 are surrounded by respective gates 140. In this example, three horizontal channels 135 connect a respective pair of S/D regions 130. These three channels 135 are then surrounded by a respective gate 140 (e.g., a high-k metal gate).

The S/D regions 130 and the channels 135 can include a semiconductor material or other material. For example, the S/D regions 130 and the channels 135 may be formed from the same semiconductor material (e.g., crystalline silicon). In another example, the channels 135 may be formed from a 2D or 1D material (e.g., transition metal dichalcogenide material such as $MoS_2$, $MoSe_2$, $MoTe_2$, $HfS_2$, $ZrS_2$, $WS_2$, $WSe_2$, $SnS$, or hexagonal boron nitride h-BN, or at least one oxide-semiconductor such as ITO, ZnO, IGZO, InGaZnO, InAlZnO, or Graphene or carbon nanotubes).

An inter-layer dielectric (ILD) 145 is arranged on top of the S/D regions 130 to provide electrical isolation and support. Further, an optional gate dielectric cap 125 is disposed on top of the gates 140. The ILD 145 and the cap 125 can be any suitable insulative material.

The ILD 145 is separated from neighboring gates 140 and caps 125 by two spacers: a first spacer liner 115 and a second spacer liner 120. As described in the process flows below, the first spacer liner 115 may be deposited on the structure before the diffusion break 110 is formed while the second spacer liner 120 is deposited on the structure after the diffusion break 110 is formed. The first spacer liner 115 may be a thin film (e.g., 3 nm) of SiN, SiBCN, SiOCN, SiCO and the like. The second spacer liner 120 may a thin film (e.g., 3 nm) of SiN, SiBCN, SiOCN, SiCO and the like.

The diffusion break 110 is formed between two S/D regions 130: one in the active region 105A and one in the active region 105B. In this example, the diffusion break 110 contacts channels 135, which are connected to the two S/D regions 130. However, because the diffusion break 110 includes an insulative material (e.g., SiN, SiC, SiCO, etc.) the connected channels 135 are non-functional. Nonetheless, these channels 135 may be helpful when forming the neighboring S/D regions 130. As discussed in FIGS. 2A-2I, having a portion of the channels 135 along the sides of the diffusion break 110 enables the use of nucleation Si for using epitaxial growth to form the S/D regions 130.

Notably, the diffusion break 110 extends into a substrate 100, unlike the gates 140, S/D regions 130, and the like. This helps to improve the isolation properties of the diffusion break 110.

The semiconductor device has several features that enable the diffusion break 110 to be narrower, and thus save area, relative to typical single diffusion breaks. First, only one spacer liner is deposited on the sides of the diffusion break 110 rather than two. That is, only the second spacer liner 120 is deposited on the sides of the diffusion break 110 in contrast to the gates 140 and caps 125 where both the first and second spacer liners 115, 120 are deposited on their sides. The second spacer liner 120 advantageously permits the diffusion break to include portions of the channels 135 which enables the use of nucleation Si when epitaxially growing the S/D regions 130. Further, using only one spacer liner rather than two in the diffusion break region reduces the distance between the active regions 105 thereby conserving area in the semiconductor device.

Second, the diffusion break 110 is not formed from a dummy gate. Instead, a conformal sacrificial liner is used, which is described below. This means that the width W2 of the diffusion break 110 can be less than a width W3 of the gate 140. For example, the width W2 may be 9 nm or less while the width W3 is typically more than 15 nm. Further, the width W1 of the second spacer liner 120 may be 3 nm or less. Thus, using the structure in FIG. 1, the total separation distance between the active regions 105 used as a diffusion break region may be 15 nm or less (2*W1+W2). In contrast, if a dummy gate were used to form the diffusion break, which would also include both the first and second spacer liners 115, 120 (assuming these liners have the same width), the total separation distance between the active regions 105 would be about 27 nm or more (4*W1+W3). Since a semiconductor device has many diffusion break regions, the combined area savings from the diffusion breaks can be significant, allowing for semiconductor devices with greater active region densities.

Figure 2A:
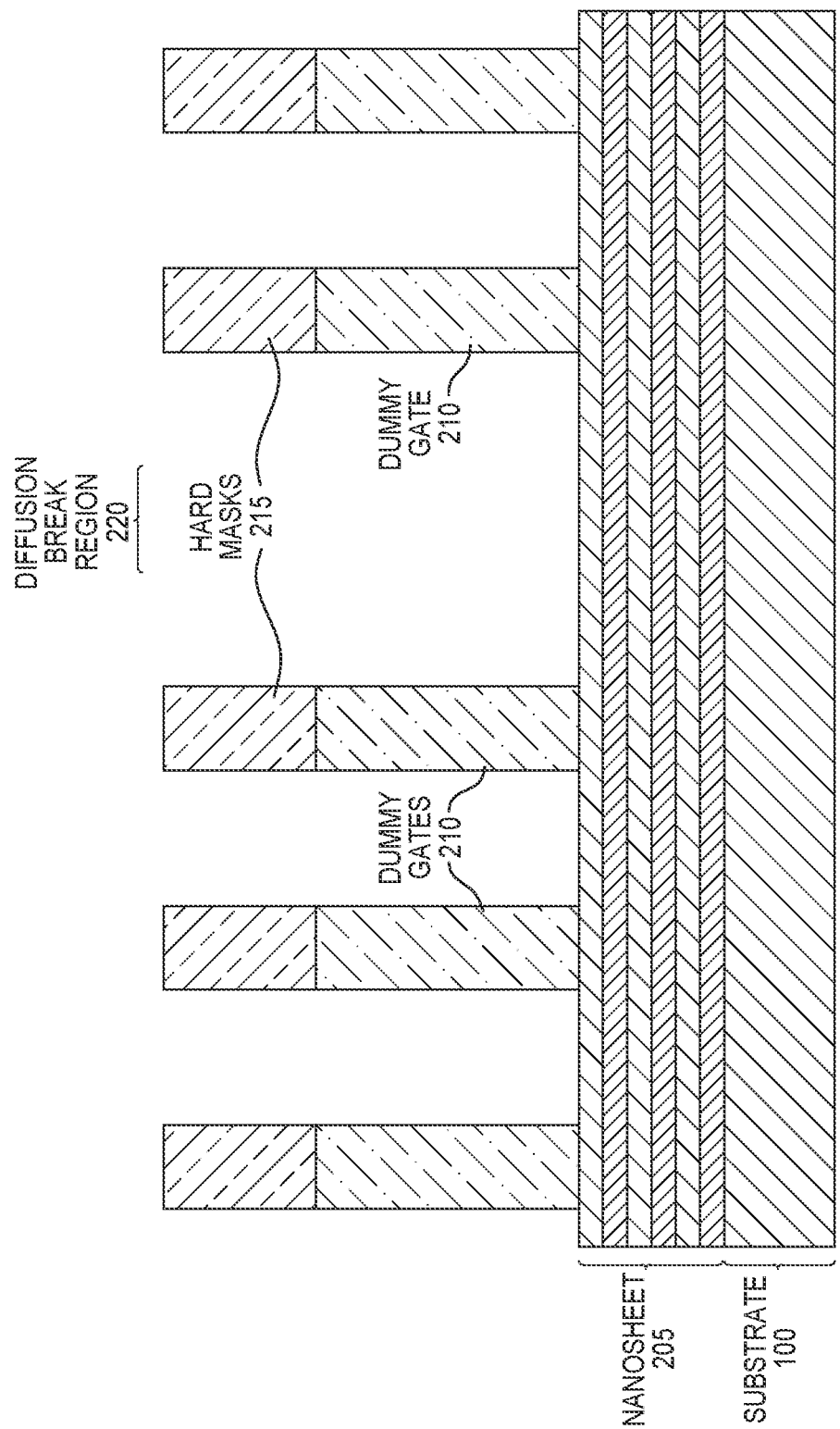

FIGS. 2A-2I illustrate forming a single diffusion break that is narrower than a gate, according to one embodiment. FIG. 2A illustrates the substrate 100 on which is formed a nanosheet 205. In one embodiment, the nanosheet 205 includes interleaved layers of Si and SiGe, but this is just an example. In general, the nanosheet 205 can include the material of the channel (e.g., the channels 135 in FIG. 1) interleaved with a sacrificial material that can be selectively etched. That is, in later processing steps, the sacrificial material is removed so that a high-k metal gate material can be deposited in its place around the channel material. Thus, the sacrificial material in the nanosheet 205 can be any material that can be selectively etched relative to the channel material.

Dummy gates 210 are formed on the nanosheet 205 at locations that match the desired locations of the "real" gates (e.g., the gates 140) which are formed in later processing steps. Notably, the dummy gates 210 are spaced apart to form a diffusion break region 220 where the diffusion break will be formed. The spacing between the neighboring dummy gates 210 defining the diffusion break region 220 may be larger than between neighboring dummy gates 210 in the active regions to the left and right of the diffusion break region 220.

Figure 2B:
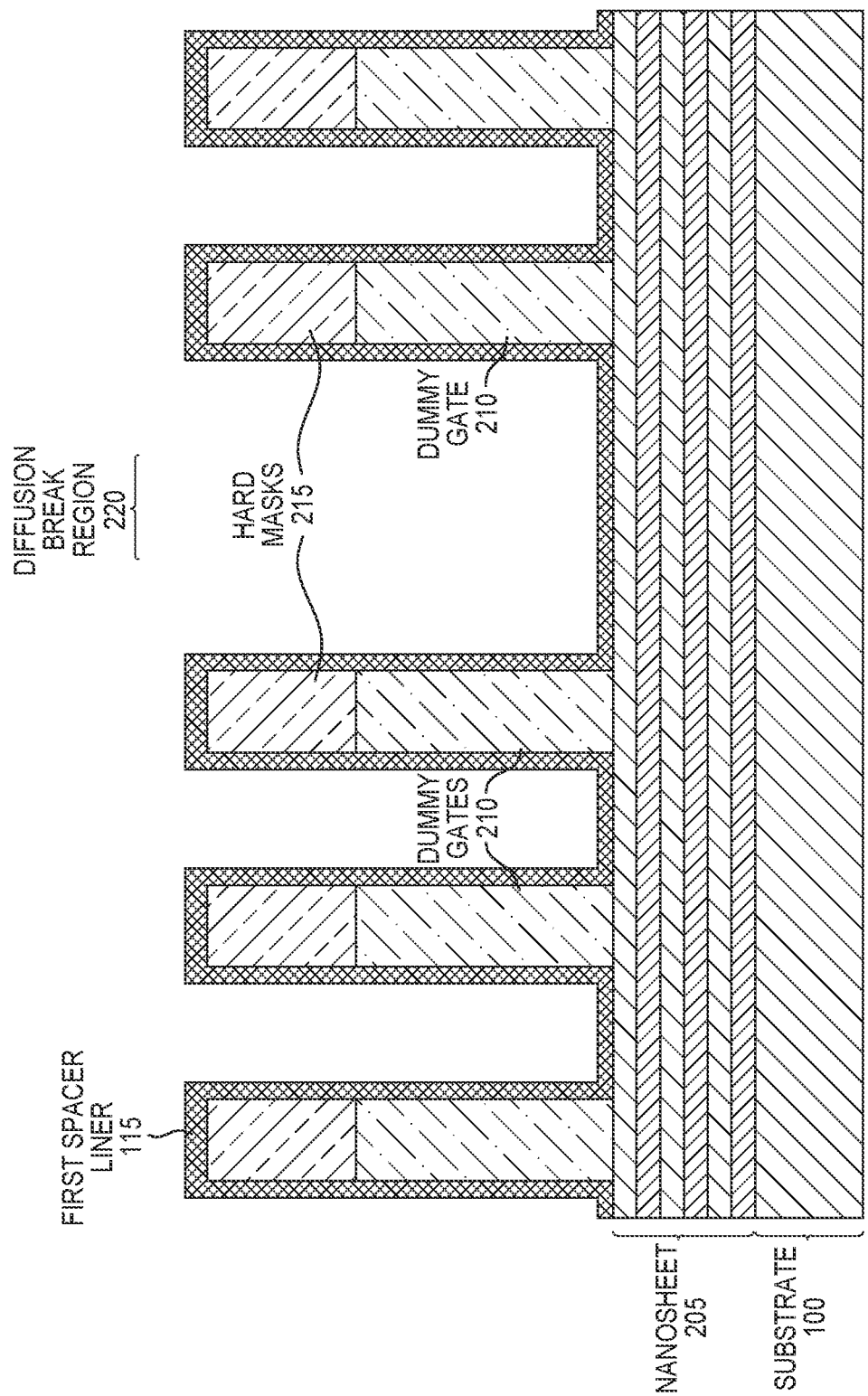

FIG. 2B illustrates depositing the first spacer liner 115 on the structure in FIG. 2A. In one embodiment, the materials of the first spacer liner 115 (e.g., SiBCN, SiOCN, SICO, etc.) is conformally deposited over the structure so the liner 115 is on the sides and top surfaces of the nanosheet 205, dummy gates 210, and the hard masks 215.

Figure 2C:
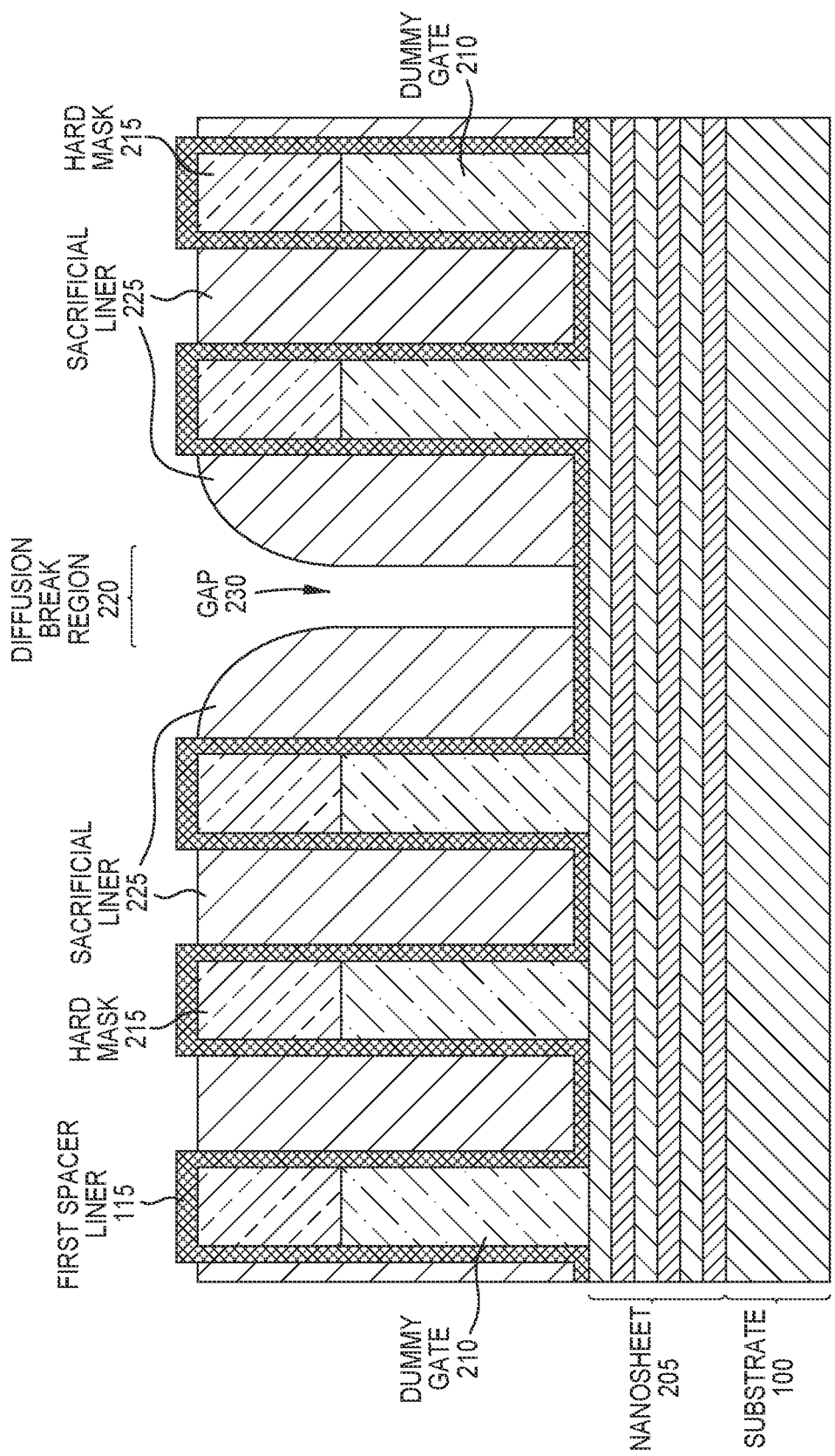

FIG. 2C illustrates depositing a sacrificial liner 225 on the structure in FIG. 2B. In one embodiment, the sacrificial liner 225 is deposited conformally on the structure. Using one or more etching steps, the sacrificial liner 225 can be etched so that a gap 230 is formed in the diffusion break region 220. For example, due to the larger separation distance between the dummy gates 210 defining the diffusion break region 220 than between the dummy gates 210 in the active regions, the sacrificial liner deposition does not pinch-off the space in the middle of the diffusion break region 220. Thus, an anisotropic etch can be used to remove the sacrificial liner 225 to form the gap 230 in the middle of the diffusion break region 220.

In one embodiment, the material of the sacrificial liner 225 is TiOx, SiO2, and the like.

Figure 2D:
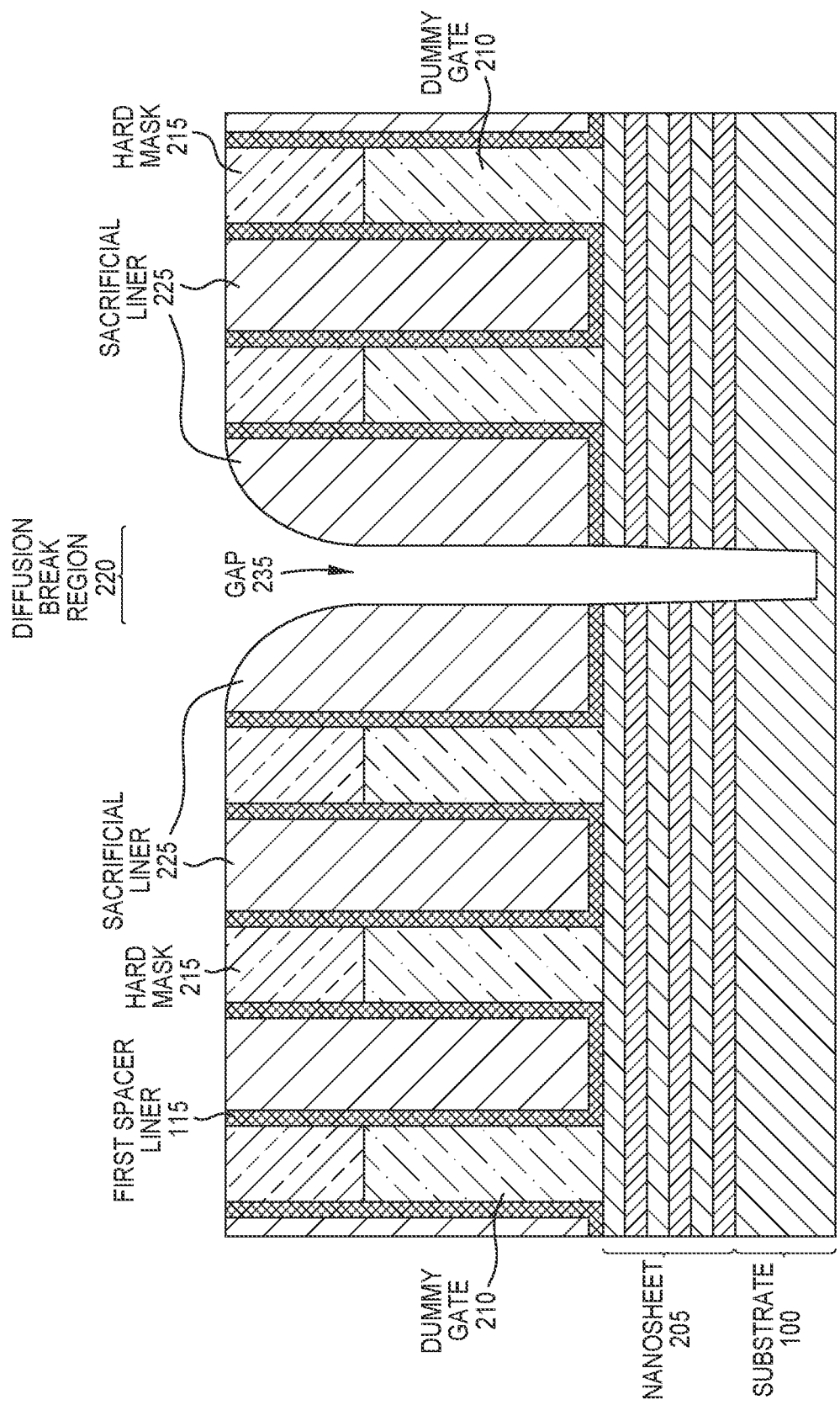

FIG. 2D illustrates an etch to open the first spacer liner 115 and etch the nanosheet/substrate. Further, the gap 230 in FIG. 2C is etched to form a deeper gap 235 which extends through the first spacer liner 115, the nanosheet 205 and partially into the substrate 100. The etch process also etches away the portion of the first spacer liner 115 over the gate hard mask 215. The deeper gap 235 provides a template for forming the diffusion break.

Figure 2E:
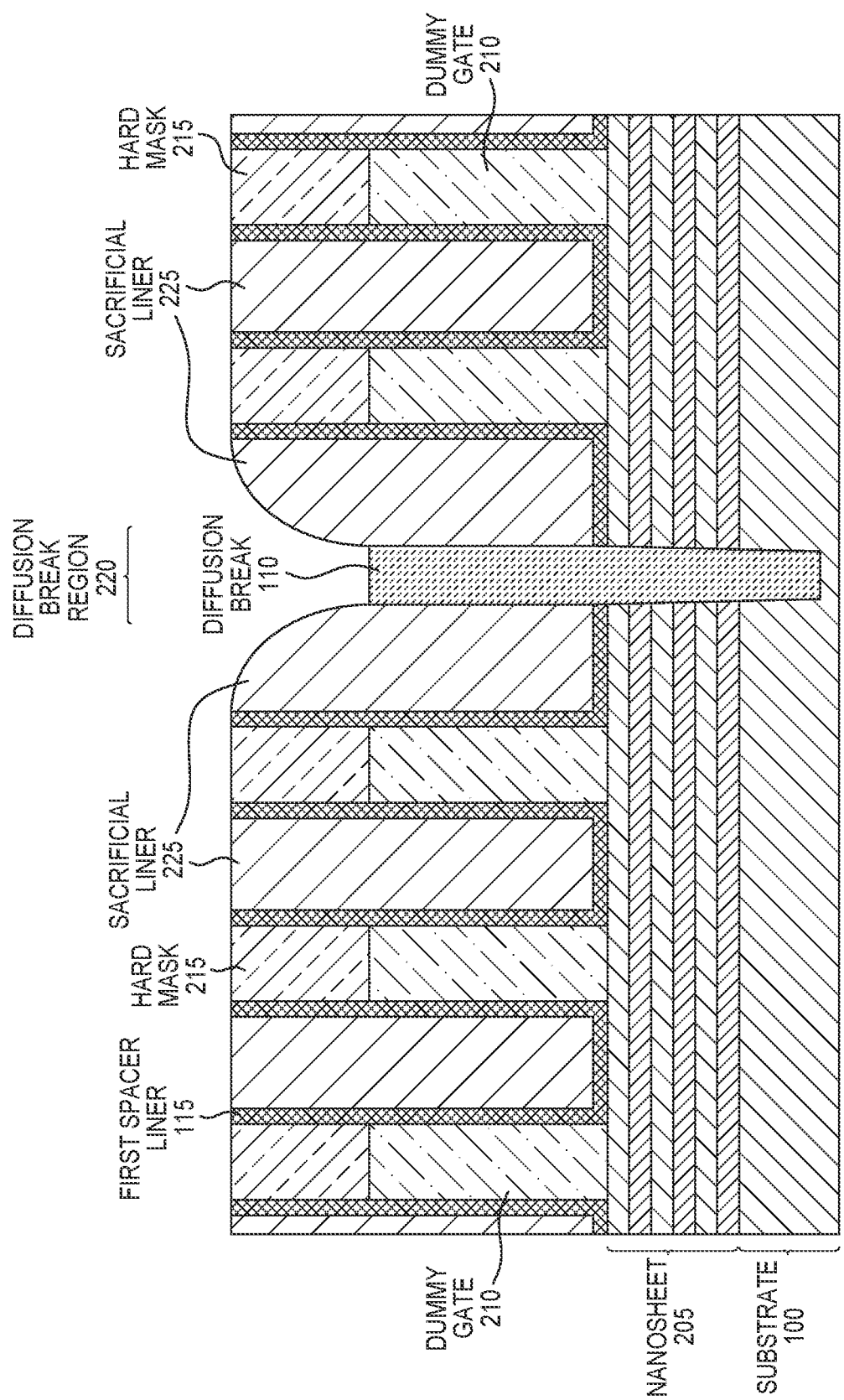

FIG. 2E illustrates forming the diffusion break 110 in the deeper gap 235 in FIG. 2D. In one embodiment, the material of the diffusion break 110 (e.g., SiN, SiC, SiCO, and the like) is deposited on the structure and then etched back to remove the material everywhere on the structure except in the gap 235 in FIG. 2D, thereby forming the diffusion break 110 in FIG. 2E.

Figure 2F:
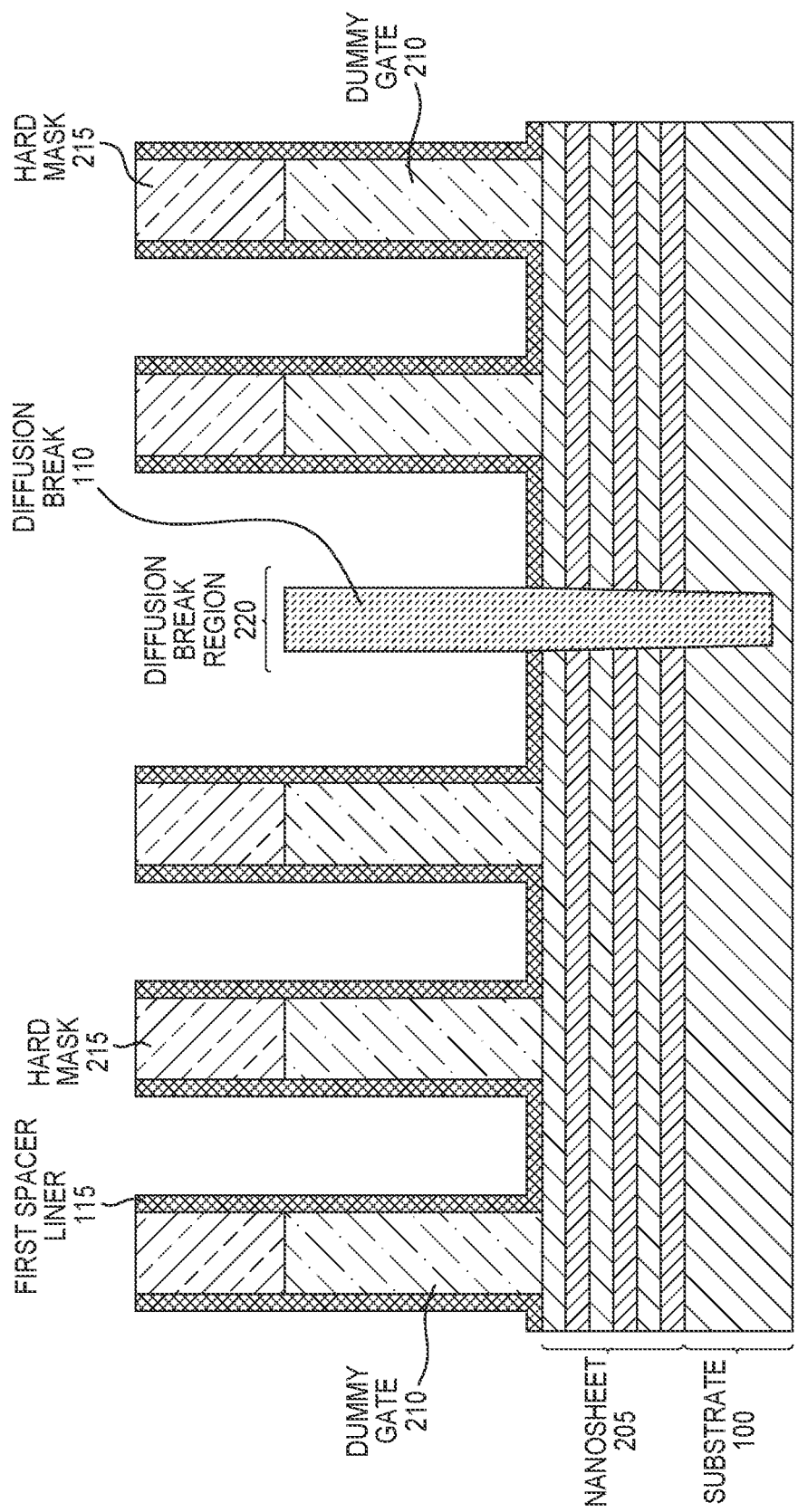

FIG. 2F illustrates removing the sacrificial liner 225 from the structure illustrated in FIG. 2E. The material of the sacrificial liner 225 can be selected so that it can be etched using an etching process that does not affect the hard mask 215, first spacer liner 115, and the diffusion break 110. In this manner, the sacrificial liner 225 can be removed while the remaining portions of the structure are unaffected.

Figure 2G:
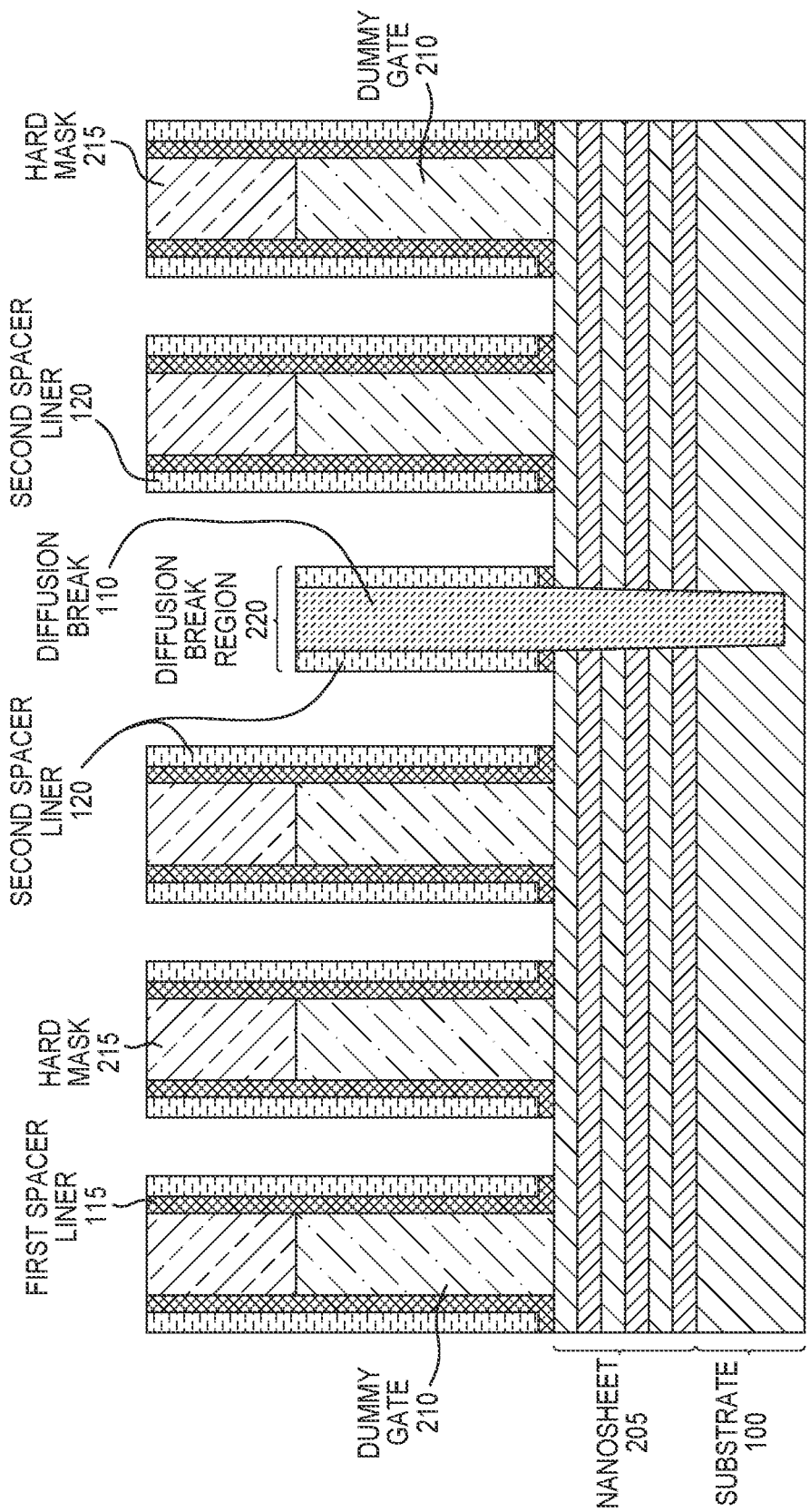

FIG. 2G illustrates forming the second spacer liner 120 on the structure. In one embodiment, the second spacer liner 120 is deposited conformally on the structure shown in FIG. 2F. An etching process (e.g., a reactive ion etch (RIE)) is then used to remove the second spacer liner 120 from the tops of the hard mask 215, the top of the diffusion break 110, and to expose the top of the nanosheet 205. This results in the structure shown in FIG. 2G. The etch process also results in a "L" shaped portion of the first spacer liner 115 on the sidewalls of the dummy gates 210, while at the single diffusion break only a very small portion of the first spacer liner 115 remains underneath the second spacer liner 120.

Figure 2H:
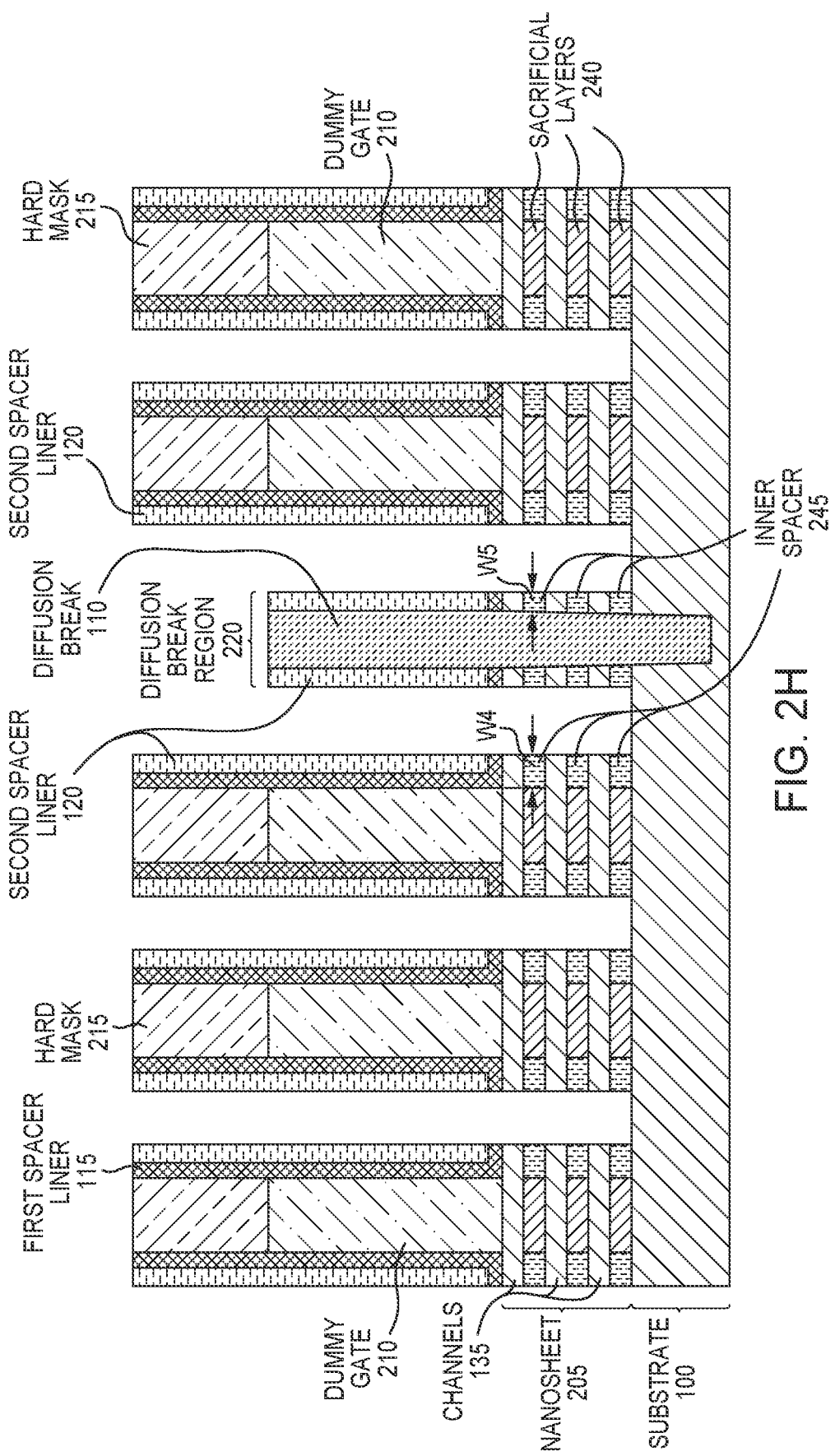
Figure 21:
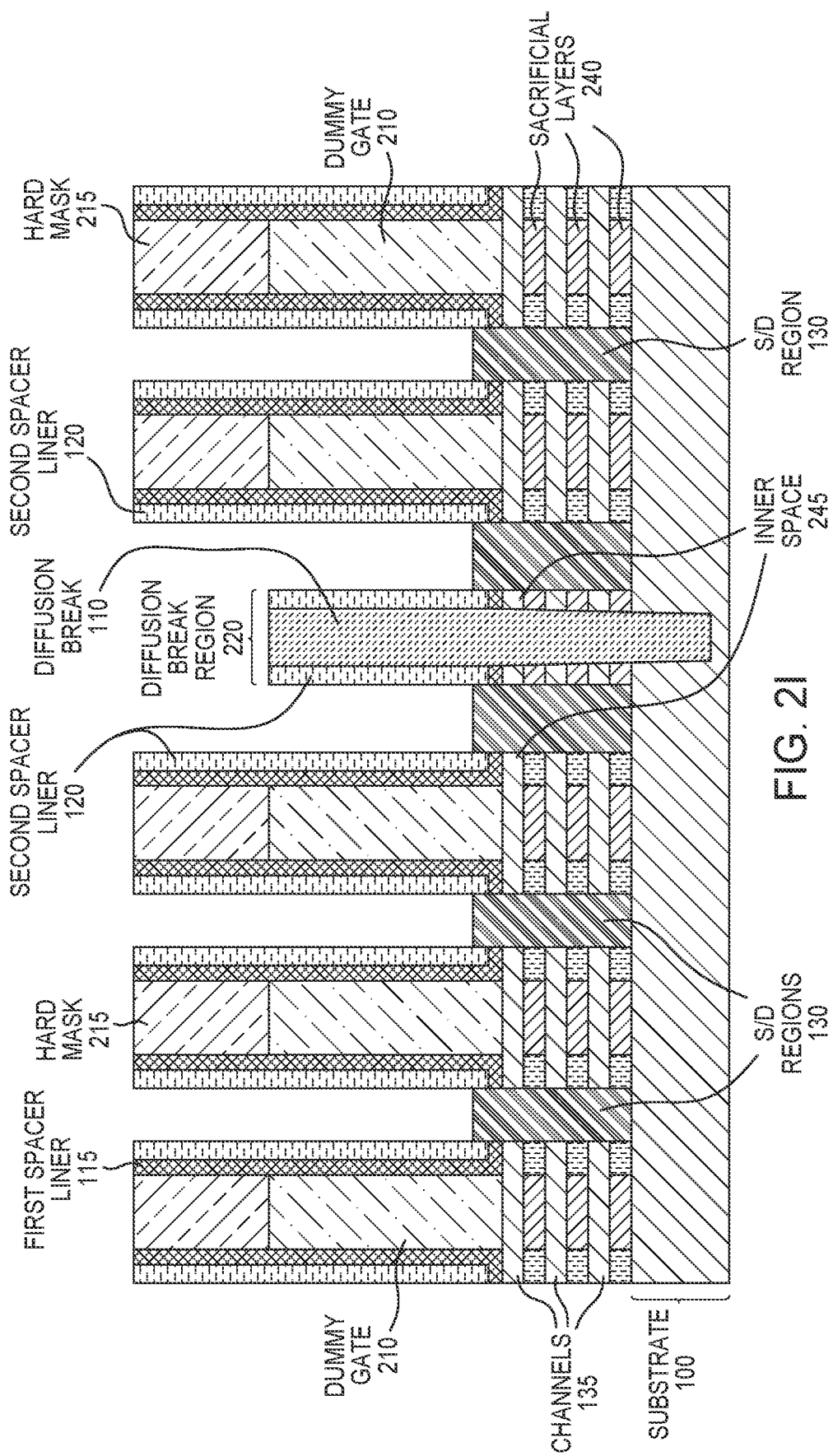

FIG. 2H illustrates etching the nanosheet 205 in the spaces between the dummy gates 210 and the diffusion break 110. That is, the portions of the nanosheet 205 between the dummy gates 210 and the diffusion break 110 are removed while the portion of the nanosheet 205 between the dummy gates 210 and the first and second spacer liners 115, 120 remain.

Further, after etching the nanosheet 205, the interleaved layers of the nanosheet are recessed. As shown, the nanosheet 205 includes the channels 135 interleaved by sacrificial layers 240. As mentioned above, the sacrificial layers 240 can be formed from a material that can be selectively etched relative to the channels 135. Thus, after etching the nanosheet 205 to expose the substrate 100, the sacrificial layers 240 are etched so that their widths are equal to or less than the width of the dummy gates 210.

Further, in this example, etching the sacrificial layers 240 completely removes this material from the sides of the diffusion break 110. However, the material of the channel 135 remains disposed on the sides of the diffusion break 110 after etching the sacrificial layers 240.

The portion of the sacrificial layers 240 removed from underneath the dummy gates 210, and the space where the sacrificial layers 240 were removed on the sides of the diffusion break, are then backfilled using an inner spacer 245. The material of the inner spacer 245 can include SiN, SiBCN, SiOCN, SiCO and the like.

Notably, the width W4 of the inner spacer 245 underneath the dummy gates 210 is larger than the width W5 of the inner spacer 245 at the sides of the diffusion break 110. This is due to the fact the dummy gates 210 have both the first and second spacer liners 115, 120 disposed on their sides. This result in wider channels 135 and sacrificial layers 240. In contrast, only the second spacer liner 120 is disposed along the sides of the diffusion break 110 which results in smaller portions of the channels 135 and the sacrificial layers 240 remaining after etching the nanosheet 205. Thus, when the sacrificial layers 240 are etched, they are etched deeper than the portion of the sacrificial layers 240 disposed on the sides of the diffusion break 110. Accordingly, when backfilled by the inner spacer 245, the spacer 245 has a smaller width W5 at the diffusion break 110 than underneath the dummy gates 210. Put differently, the width W5 of the inner spacer 245 along the sides of the diffusion break 110 is determined, at least in part, by the width of the second spacer liner 120, while the width of the inner spacer 245 underneath the dummy gates 210 is determined, at least in part, by the widths of both the first and second spacer liners 115, 120. Backfilling the etched sacrificial layers 240 with the inner spacer 245 results in the structure shown in FIG. 2H.

FIG. 2I illustrates forming S/D regions between the dummy gates 210 in the active region and between the dummy gates 210 and the diffusion break 110. In one embodiment, the S/D regions 130 adjacent to the diffusion break 110 can be formed during the same processing steps used to form the S/D regions 130 between the dummy gates 210 in the active region.

In one embodiment, the S/D regions 130 are grown epitaxially. In one embodiment, silicon nucleation is used to grow the S/D regions 130. Advantageously, because a portion of the channels 135 remains disposed along the sides of the diffusion break 110, these channels 135 can be used during silicon nucleation to grow the S/D regions 130 adjacent to the diffusion break 110, thereby improving the S/D regions 130 relative to a structure where the channels material is not disposed along the sides of the diffusion break 110.

In one embodiment, the portions of the channels 135 disposed along the sides of the diffusion break 110 are not used as part of an active device (e.g., to operate a FET). Instead, these portions of the channel ma may be used to help grow the S/D regions 130 but when in operation, are unused, unlike the channels 135 in the active regions.

In other embodiments, the portions of the channels 135 disposed along the sides of the diffusion break 110 may be omitted from the structure. For example, if the second spacer liner 120 is not disposed along the sides of the diffusion break 110, then when etching the nanosheet 205 as shown in FIG. 2H, most or all of the channels 135 and sacrificial layers 240 will be removed along the sides of the diffusion break 110. This would advantageously reduce the width of the diffusion break region (since there would no longer be the spacer liner 120, the channels 135, and the inner spacer 245 disposed along the sides of the diffusion break 110) but this may result in a lesser quality S/D regions 130 since there is no channel material on the sides of the diffusion break 110 to assist in the epitaxial growth.

Additional processing steps can then be performed on the structure shown in FIG. 2I so it forms the semiconductor device shown in FIG. 1. Specifically, ILD is deposited over the S/D regions, followed by CMP process to expose the dummy gates. After that, the remaining portions of the sacrificial layers 240 and the dummy gates 210 are removed and replaced with the material of the gates 140 (e.g., a replacement high-k metal gate (HKMG)). That is, in one etching step, the dummy gates 210 are removed, and in a second etching step, the sacrificial layer 240 between the channels 135 are removed. The material of the gates 140 is then deposited into the volumes vacated by the sacrificial layers 240 and the dummy gates 210 to form replacement HKMG.

In addition, HKMG can be optionally recessed and gate dielectric cap 125 are formed on top of the recessed gates 140, while the ILDs 145 are formed on top of the S/D regions 130. Thus, FIGS. 2A-2I illustrate one example process for forming the semiconductor device in FIG. 1.

Figure 3:
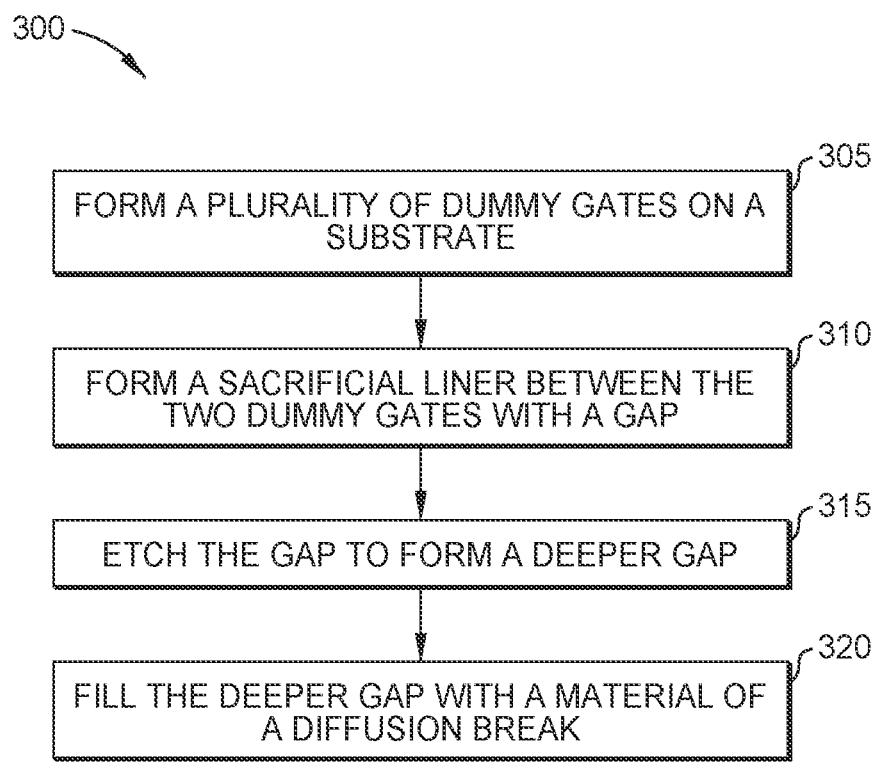
FIG. 3 is a flowchart for forming a single diffusion break, according to one embodiment.

FIG. 3 is a flowchart of a method 300 for forming a single diffusion break, according to one embodiment. At block 305, a plurality of dummy gates are formed on a substrate. One example of block 305 is illustrated in FIG. 2A where the dummy gates 210 are formed on the substrate 100 and the nanosheet 205. Further, a diffusion break region 220 is defined between two of the dummy gates 210.

At block 310, a sacrificial liner is formed between the two dummy gates. One example of block 310 is illustrated in FIG. 2C where the sacrificial liner 225 is deposited and etched to define the gap 230 within the diffusion break region 220.

At block 315, the gap is etched to form a deeper gap that extends through channel material and into the substrate. One example of block 315 is illustrated in FIG. 2D where structure is etched to form the deeper gap 235 which extends completely through the nanosheet 205 and at least partially through the substrate 100.

At block 320, the deeper gap is filled with a material of a diffusion break. One example of block 320 is illustrated in FIG. 2E where the deeper gap 235 has been filled with the material of the diffusion break 110. Another example of block 320 is illustrated in FIG. 4B where the diffusion break 410 is formed using the gap 405 in FIG. 4A as a template. Unlike the gap 235 in FIG. 2D, the gap 405 in FIG. 4A has a sawtooth pattern where portions of the sacrificial layer 240 at the edges of the gap 405 have been recessed relative to the channels 135.

Figure 4A:
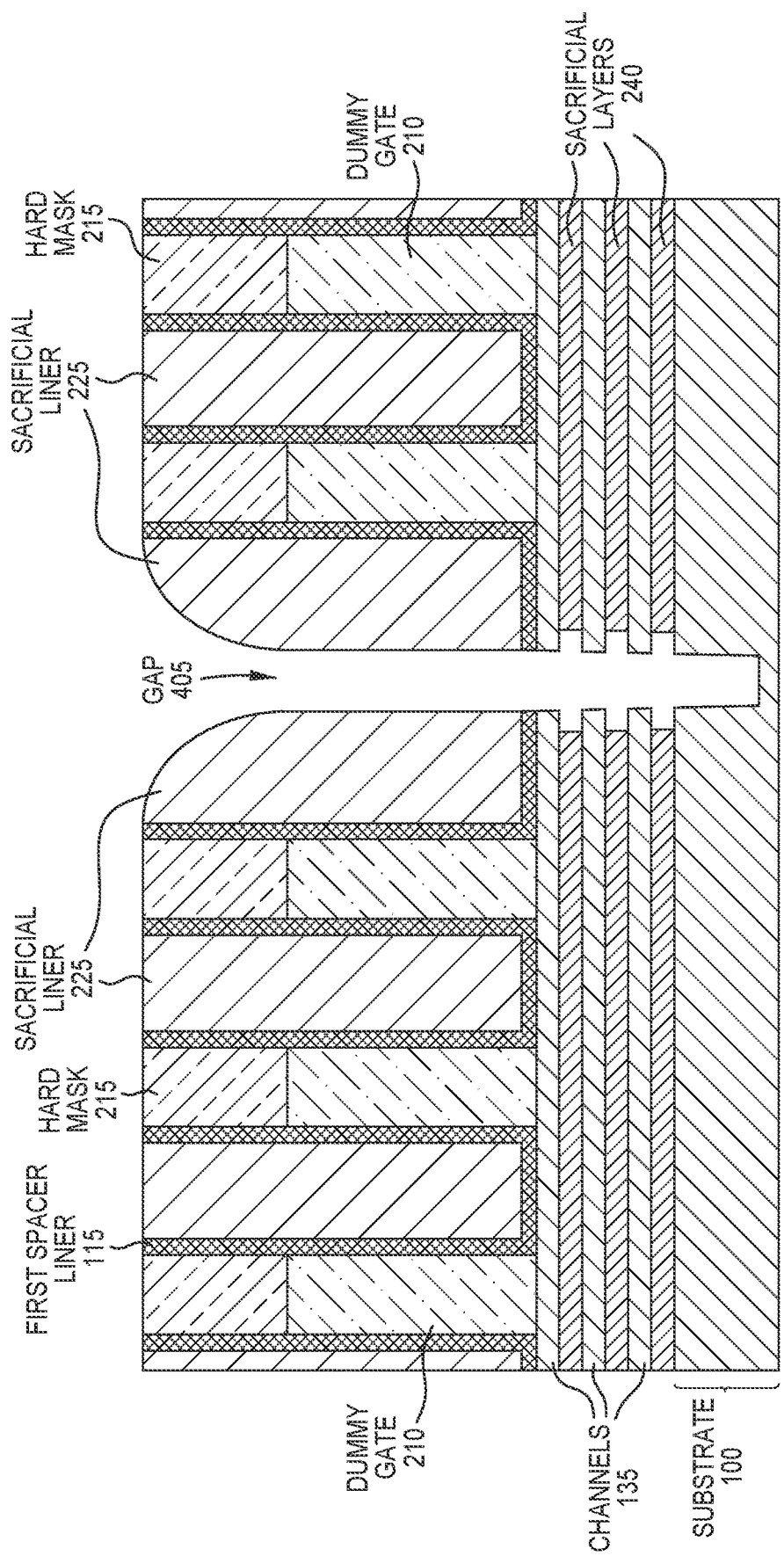
FIGS. 4A-4C illustrate forming a single diffusion break that is narrower than a gate, according to one embodiment.
Figure 4B:
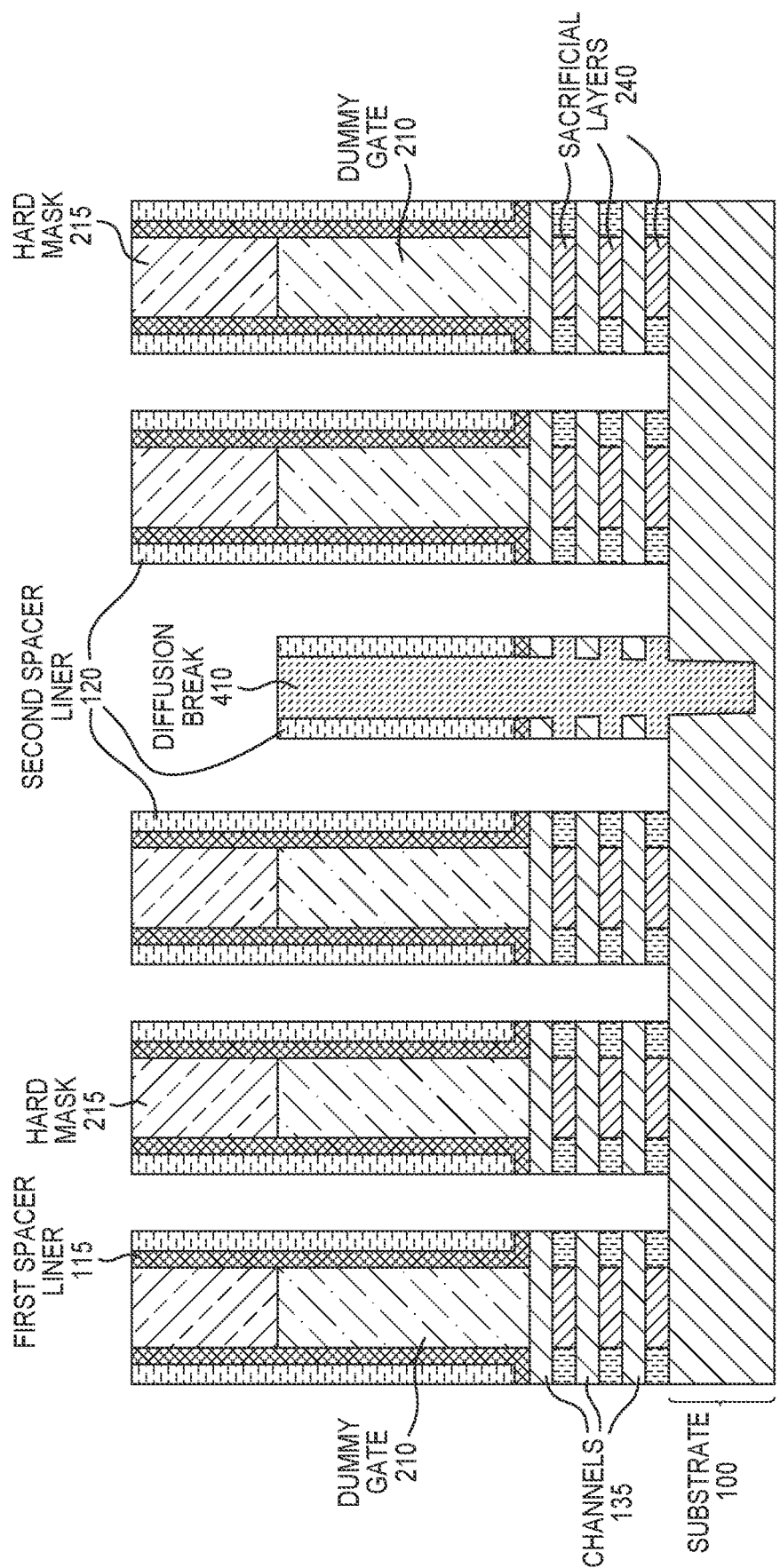
Figure 4C:
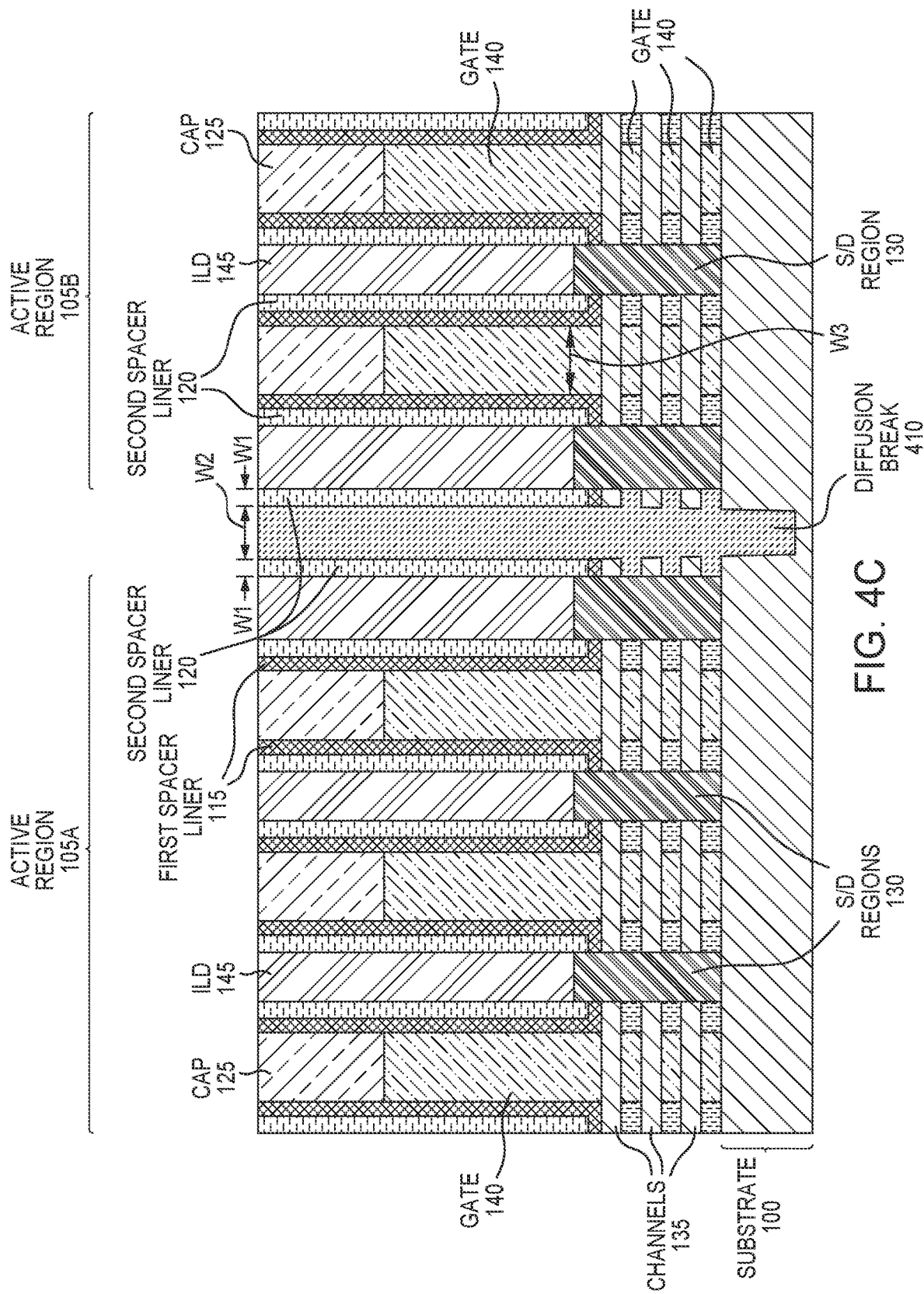

FIGS. 4A-4C illustrate forming a single diffusion break that is narrower than a gate, according to one embodiment. FIGS. 4A-4C illustrate a different, but similar, process than the one shown in FIGS. 2A-2I. In any case, both processes result in a diffusion break with a width that is less than a width of the gates in the active regions.

FIG. 4A begins after FIG. 2D where the gap 235 has been formed in the sacrificial liner 225, the nanosheet 205, and into the substrate 100. However, instead of proceeding with depositing the diffusion break 110 into the gap 235 (as shown in FIG. 2E), in FIG. 4A a selective etch is used to remove a portion of the sacrificial layers 240 at the edges to form a gap 405. For example, this selective etch may remove 3-5 nm of the sacrificial layers 240 at the edges of the gap 405. However, the channels 135 are not affected by this etch since, as discussed above, the material of the channels 135 and the sacrificial layers 240 are selected so the sacrificial layers 240 can be selectively etched.

The structure shown in FIG. 4B is obtained by forming a diffusion break 410 in the gap 405 shown in FIG. 4A and then removing the sacrificial liner 225 similar to what is shown in FIG. 2F. The second spacer liner 120 is then formed and patterned similar to what is shown in FIG. 2G. Moreover, the nanosheet 205 is exposed so it can be etched to expose the upper surface of the substrate 100, thereby resulting in the structure illustrated in FIG. 4B.

The structure in FIG. 4B may be the same as the structure in FIG. 2H except there is no inner spacer 245 formed along the sides of the diffusion break 410. Instead, the volume previously occupied by the inner spacer 245 is instead occupied by the material of the diffusion break 410.

Advantageously, the structure in FIG. 4B still has portions of the channels 135 disposed along the sides of the diffusion break 410. Thus, silicon nucleation can be used to epitaxially grow the S/D regions adjacent to the diffusion break 410.

FIG. 4C illustrates a semiconductor device formed using the process described in FIGS. 4A-4B. In one embodiment, the device in FIG. 4C is the same as the device in FIG. 1 except for the differently shaped diffusion break 410. Thus, after forming the diffusion break 410, the same processing steps discussed in FIGS. 2F-2I can be used to form the semiconductor device illustrated in FIG. 4C.

Moreover, the semiconductor device in FIG. 4C has a reduced width diffusion break region compared to a diffusion region formed using a dummy gate. This means that the width of the diffusion break 410 can be less than a width of the gates 140. For example, the width of the diffusion break 410 may be 9 nm or less while the width of the gates 140 is typically 18 nm. Further, the width of the second spacer liner 120 may be 3 nm or less. Thus, using the structure in FIG. 4C, the total separation distance between the active regions 105 used to form the diffusion break 410 may be 15 nm. In contrast, if a dummy gate were used to form the diffusion break, which would also include both the first and second spacer liners 115, 120 (assuming these liners have the same width), the total separation distance between the active regions 105 would be 30 nm. Since a semiconductor device can have many diffusion breaks, the combined area savings from the diffusion breaks can be significant, allowing for semiconductor devices with greater active region densities.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A semiconductor device comprising:
   a first active region comprising a first transistor with a first gate disposed on a substrate;
   a second active region comprising a second transistor with a second gate disposed on the substrate;
   a diffusion break region disposed between the first and second active regions, the diffusion break region comprising a diffusion break that extends into the substrate and has a width that is less than widths of the first and second gates; and
   a first spacer liner contacting sides of the first and second gates;
   a second spacer liner contacting (i) the first spacer liner, wherein the first and second spacer liners both contact the sides of the diffusion break, wherein a width of the second spacer liner and the diffusion break define a total width of the diffusion break region, and wherein the second spacer liner contacts source/drain (S/D) regions in the first active region and the second active region; and
   wherein the diffusion break region further comprises:
      portions of channels disposed along the sides of the diffusion break, wherein the portions of the channels are disposed underneath the second spacer liner and contact the S/D regions.

2. The semiconductor device of claim 1, wherein a width of the diffusion break is 9 nm or less and a width of the second spacer liner is 3 nm or less, wherein the total width of the diffusion break region is 15 nm or less.

3. The semiconductor device of claim 1, wherein the diffusion break is a dielectric material.

4. The semiconductor device of claim 3, wherein the dielectric material comprises at least one of: SIN, SiC, or SiCO.

5. The semiconductor device of claim 1, wherein the first and second transistors each comprises a plurality of channels surrounded by the first and second gates, respectively.

6. The semiconductor device of claim 5, wherein the first and second gates are replacement high-k metal gates (HKMG).

7. A semiconductor device comprising:
   a first active region comprising a first transistor;
   a second active region comprising a second transistor; and
   a diffusion break region disposed between the first and second active regions, the diffusion break region comprising:
      a diffusion break and a spacer liner disposed on both sides of the diffusion break, wherein a combined width of the diffusion break and the spacer liner is 15 nm or less and wherein the spacer liner contacting the sides of the diffusion break also contacts source/drain (S/D) regions in the first active region and the second active region; and
      portions of channels disposed along the sides of the diffusion break, wherein the portions of the channels are disposed underneath the spacer liner and also contact the S/D regions.

8. The semiconductor device of claim 7, wherein the first transistor comprises a first gate and the second transistor comprises a second gate, wherein a width of the diffusion break is less than widths of the first and second gates.

* * * * *